(12) United States Patent
Ge

(10) Patent No.: US 11,728,412 B2
(45) Date of Patent: Aug. 15, 2023

(54) METHOD FOR MANUFACTURING THIN FILM TRANSISTOR, AND DISPLAY PANEL

(71) Applicant: HKC CORPORATION LIMITED, Shenzhen (CN)

(72) Inventor: Bangtong Ge, Chongqing (CN)

(73) Assignee: HKC CORPORATION LIMITED, Shenzhen (CN)

( * ) Notice: Subject to any disclaimer, the term of this patent is extended or adjusted under 35 U.S.C. 154(b) by 240 days.

(21) Appl. No.: 17/312,005

(22) PCT Filed: Dec. 5, 2019

(86) PCT No.: PCT/CN2019/123232
§ 371 (c)(1),
(2) Date: Jun. 9, 2021

(87) PCT Pub. No.: WO2020/134937
PCT Pub. Date: Jul. 2, 2020

(65) Prior Publication Data
US 2022/0013656 A1 Jan. 13, 2022

(30) Foreign Application Priority Data

Dec. 25, 2018 (CN) .......................... 201811587237.9

(51) Int. Cl.
*H01L 29/66* (2006.01)
*H01L 21/02* (2006.01)
*H01L 27/12* (2006.01)

(52) U.S. Cl.
CPC .. *H01L 29/66765* (2013.01); *H01L 21/02422* (2013.01); *H01L 21/02532* (2013.01); *H01L 21/02672* (2013.01); *H01L 27/1259* (2013.01)

(58) Field of Classification Search
None
See application file for complete search history.

(56) References Cited

U.S. PATENT DOCUMENTS 5,696,003 A * 12/1997 Makita ............. H01L 21/02672
257/E27.111
6,423,196 B1 * 7/2002 Ivanvov ............. C23C 14/3414
204/192.12

(Continued)

FOREIGN PATENT DOCUMENTS

| CN | 1102908 A | 5/1995 |
|----|-----------|--------|
| CN | 1741257 A | 3/2006 |

(Continued)

OTHER PUBLICATIONS

A Chinese office action dated Apr. 8, 2020 and translated into English for a counterpart Chinese application of the present application, total pp. 11.*

(Continued)

*Primary Examiner* — Bo B Jang

(57) ABSTRACT

This application discloses a method for manufacturing a thin film transistor, and a display panel. The method for manufacturing a thin film transistor includes steps of providing a substrate; forming an amorphous silicon thin film layer on the substrate; patterning the amorphous silicon thin film layer to form an amorphous silicon layer; forming a metal seed layer made of a nickel disilicide ($NiSi_2$) material on the amorphous silicon layer; converting the amorphous silicon layer into a polysilicon layer under an induction effect of the metal seed layer and through an annealing treatment; and forming a source and drain layer.

17 Claims, 6 Drawing Sheets

(56) References Cited

U.S. PATENT DOCUMENTS

| | | | | |
|---|---|---|---|---|
| 6,713,330 | B1* | 3/2004 | Zhang | H01L 21/02496 438/166 |
| 2002/0015268 | A1 | 2/2002 | Mao et al. | |
| 2004/0263707 | A1* | 12/2004 | Seo | H01L 27/1277 257/E21.133 |
| 2004/0266082 | A1 | 12/2004 | You | |

FOREIGN PATENT DOCUMENTS

| | | |
|---|---|---|
| CN | 102074502 A | 5/2011 |
| CN | 107611141 A | 1/2018 |
| CN | 109727875 A | 5/2019 |

OTHER PUBLICATIONS

Jiaqiu Liu, the ISA written comments, Mar. 2020, CN.
Jiaqiu Liu, the International Search Report, Mar. 2020, CN.
Fabrication of High Performance Poly-Si Thin Films Transistors by Nickel Silicide Induced Lateral Crystallization, Jun. 2012, CN.

* cited by examiner

METHOD FOR MANUFACTURING THIN FILM TRANSISTOR, AND DISPLAY PANEL

CROSS REFERENCE OF RELATED APPLICATIONS

This application claims priority to Chinese Patent Application No. CN201811587237.9, filed with the National Intellectual Property Administration, PRC on Dec. 25, 2018 and entitled "METHOD FOR MANUFACTURING THIN FILM TRANSISTOR, AND DISPLAY PANEL", which is incorporated herein by reference in its entirety.

TECHNICAL FIELD

This application relates to the field of display technology, and in particular, to a method for manufacturing a thin film transistor, and a display panel.

BACKGROUND

Understandably, the description in the background section merely provides background information related to this application, but does not necessarily constitute related art.

A LTPS TFT (low-temperature polysilicon thin film transistor) is widely applied in field of flat-panel displays due to its relatively good electrical performance and suitability for being made into an integrated circuit. SPC (solid-phase crystallization) and ELA (excimer laser annealing) are methods commonly used for crystallizing amorphous silicon. However, the excimer laser annealing is highly costly and generates grains that are distributed unevenly. The solid-phase crystallization requires heating at a high temperature for a long time. This not only leads to a phase transition of a glass substrate board, but also reduces production efficiency of a panel.

Metal-induced crystallization is another solid-phase crystallization technology, in which metallic nickel is generally used. This method requires a low temperature for crystallization, but residual metal remains in a thin film transistor manufactured in this method, resulting in a relatively large leakage current. There are some technologies under research to remove the residual metal in the thin film transistor, for example, Ni off-set MILC (Ni off-set metal seed-induced lateral crystallization), and a gettering technology implemented by adding a coating ($SiN_x$, $SiO_2$). However, such technologies are complicated and require long-term high-temperature annealing. This may disrupt the thin film transistor and lead to performance deterioration.

SUMMARY

This application provides a method for manufacturing a thin film transistor, and a display panel, to effectively reduce residual metal, shorten crystallization annealing time, and prepare a low-temperature polysilicon thin film transistor (LTPS TFT) that is of high quality and stable performance.

This application discloses a method for manufacturing a thin film transistor, including steps of:
providing a substrate;
forming an amorphous silicon thin film layer on the substrate;
patterning the amorphous silicon thin film layer to form an amorphous silicon layer;
forming a metal seed layer on the amorphous silicon layer, the metal seed layer being made from nickel disilicide material; and
converting the amorphous silicon layer into a polysilicon layer under an induction effect of the metal seed layer and through an annealing treatment.

This application discloses another method for manufacturing a thin film transistor, including steps of:
forming a gate metal layer on a surface of the substrate by using a first photomask process;
sequentially forming a gate insulation layer and an intrinsic amorphous silicon thin film layer on the gate metal layer;
forming an etching barrier layer on an intrinsic amorphous silicon layer by using a second photomask process;
forming a doped amorphous silicon thin film layer on the etching barrier layer, where the doped amorphous silicon thin film layer overlays the etching barrier layer, and the intrinsic amorphous silicon thin film layer outside a region overlaid by the etching barrier layer;
forming the intrinsic amorphous silicon layer and a doped amorphous silicon layer by using a third photomask process, and a channel corresponding to the surface of the etching barrier layer is formed on the doped amorphous silicon layer;
forming a protection layer that overlays the channel by using a fourth photomask process;
forming a metal seed layer made of a nickel disilicide material on the amorphous silicon layer;
converting the intrinsic amorphous silicon layer into an intrinsic polysilicon layer under an induction effect of the metal seed layer and through an annealing treatment, converting the doped amorphous silicon layer into a doped polysilicon layer under an induction effect of the metal seed layer and through an annealing treatment;
forming a source and a drain on the doped polysilicon layer by using a fifth photomask process; and
forming an insulation interlayer on the source and the drain;
where a temperature range of the annealing-crystallization is between 400° C. and 600° C., and a time range of the annealing-crystallization is between 0.5 h and 2 h.

This application further discloses a display panel, including a plurality of scanning lines, a plurality of data lines, a plurality of pixel electrodes, and a plurality of active switches, where each active switch is a thin film transistor, and the thin film transistors each sequentially include a substrate, a gate metal layer, a gate insulation layer, a polysilicon layer, a source and a drain on the substrate;
where the source of the thin film transistor is connected to the data lines, a gate is connected to the scanning lines, and the drain is connected to the pixel electrodes; and the polysilicon layer is made by using the following method:
forming an amorphous silicon layer on the gate insulation layer;
forming a metal seed layer on the amorphous silicon layer, the metal seed layer being made from nickel disilicide material; and
converting the amorphous silicon layer into the polysilicon layer under an induction effect of the metal seed layer and through an annealing treatment.

In a contrast solution, the metal seed layer is formed on the amorphous silicon layer, metal-induced crystallization is directly applied, and a metal layer that remains unreacted before crystallization is not removed. Consequently, more metal atoms are diffused during heating and crystallization, and too many residual metal atoms remain in the thin film transistor, thereby leading to a relatively large leakage current of the thin film transistor. In this application, a metal seed-induced crystallization method is applied. Therefore, only the metal atoms in a seed layer are diffused, thereby effectively reducing the residual metal in the amorphous silicon layer and reducing the leakage current. Moreover, grains grow larger, thereby improving performance of the thin film transistor. In addition, in this application, the metal seed layer is deposited after the amorphous silicon layer is formed, that is, after the amorphous silicon thin film layer is patterned through the photomask process, thereby massively reducing an area of the amorphous silicon layer and effectively shortening the crystallization annealing time. This solution is also applicable to a low-temperature polysilicon (LTPS) technology.

BRIEF DESCRIPTION OF DRAWINGS

The drawings outlined below constitute a part of the specification and are intended to enable a further understanding of the embodiments of this application, illustrate the embodiments of this application, and expound the principles of this application with reference to the text description. Apparently, the drawings outlined below are merely a part of embodiments of this application. A person of ordinary skill in the art may derive other drawings from the drawings without making any creative efforts. In the drawings.

DETAILED DESCRIPTION OF EMBODIMENTS

Figure 1:
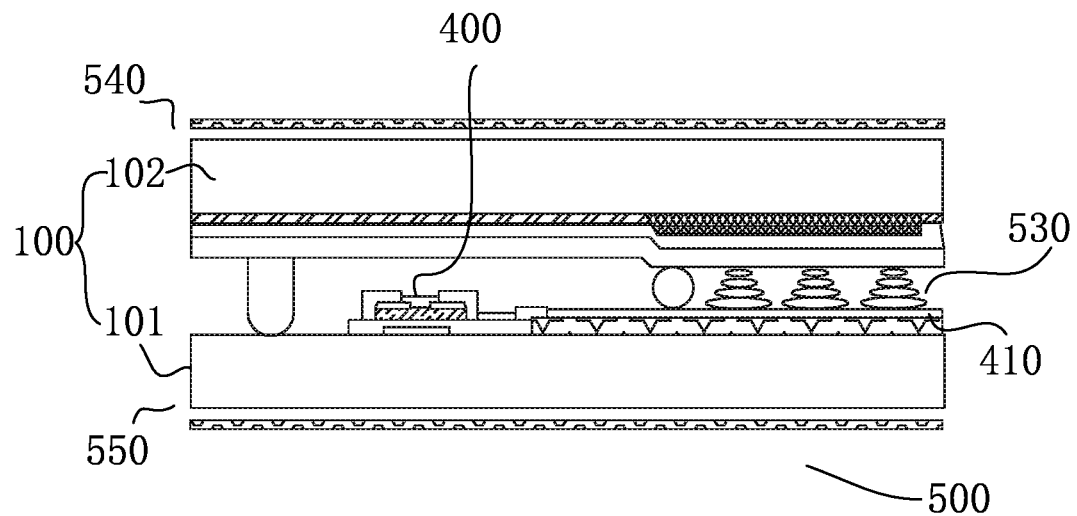
FIG. 1 is a schematic structural diagram of a display panel according an embodiment of this application.

Specific structures and functional details disclosed herein are merely representative, and are intended for describing exemplary embodiments of this application. However, this application may be specifically implemented in many substitutional forms, and is not to be construed as being limited to the embodiments described herein.

Understandably, in the context of this application, a direction or a positional relationship indicated by the terms such as "center", "transverse", "upper", "lower", "left", "right", "vertical", "horizontal", "top", "bottom", "inner", and "outer" is a direction or positional relationship based on the illustration in the drawings, and is merely intended for ease or brevity of description of this application, but does not indicate or imply that the indicated device or component must be located in the specified direction or constructed or operated in the specified direction. Therefore, such terms are not to be understood as a limitation on this application. In addition, the terms "first" and "second" are used merely for descriptive purposes but are not to be construed as indicating or implying relative importance or implicitly specifying the quantity of technical features indicated. Therefore, a feature qualified by "first" or "second" may explicitly or implicitly include one such feature or a plurality of the features. In the context of this application, unless otherwise specified, "a plurality of" means two or more. In addition, the terms "include", "comprise", and any variations thereof are intended as non-exclusive inclusion.

In the context of this application, it needs to be noted that, unless otherwise expressly specified and qualified, the terms "mount", "concatenate", and "connect" need to be understood in a broad sense, for example, understood as a fixed connection, a detachable connection, or an integrated connection; as a mechanical connection or an electrical connection; as a direct connection or an indirect connection implemented through an intermediary; or as interior communication between two components. A person of ordinary skill in the art can understand the specific meanings of the terms in this application according to the context.

The terms used herein are merely intended for describing specific embodiments but are not intended to limit the exemplary embodiments. Unless otherwise expressly specified in the context, singular nouns qualified by "a" and "an" herein are intended to include the plural forms thereof. Understandably, the terms "include", "comprise", and/or "contain" used herein specify the existence of the stated features, integers, steps, operations, units, and/or components, but do not exclude the existence or addition of one or more other features, integers, steps, operations, units, components, and/or any combinations thereof.

The following describes this application in further detail with reference to drawings and optional embodiments.

Figure 2:
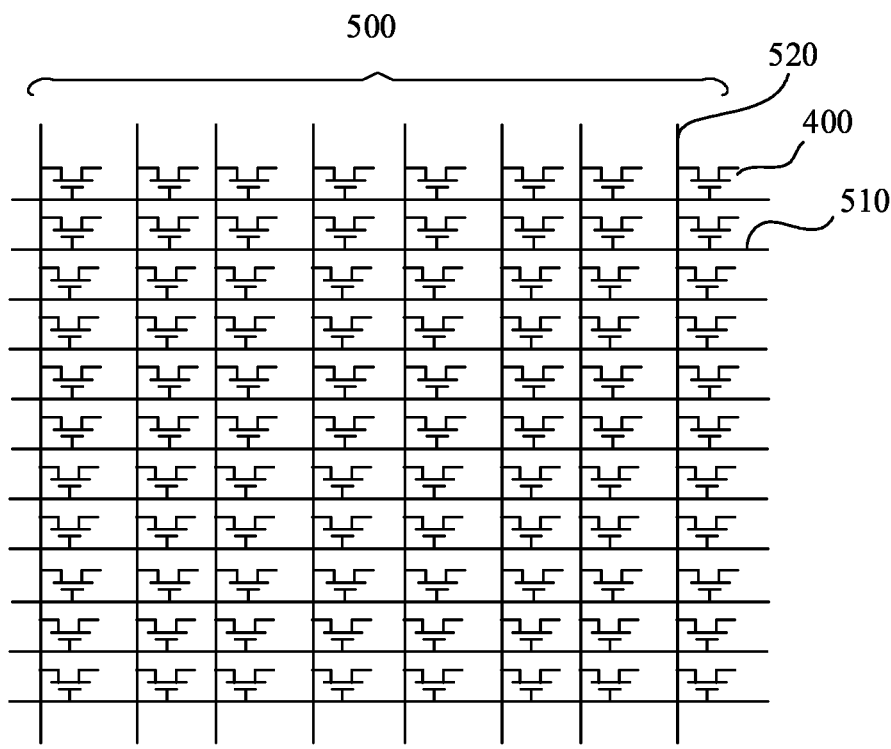
FIG. 2 is a schematic diagram of a display panel according an embodiment of this application.

As shown in FIG. 1 to FIG. 2, this application discloses a display panel 500, including a first substrate board 540 and a second substrate board 550 that are oppositely disposed. A data line 520 is disposed between the first substrate board 540 and the second substrate board 550. The first substrate board 540 is an array substrate board, and includes a plurality of scanning lines 510, a plurality of data lines 520, a plurality of pixel electrodes 410, and a plurality of active switches. Each active switch is a thin film transistor 400. The thin film transistor 400 includes: a substrate 101; a gate metal layer 120, a gate insulation layer 130, and a polysilicon layer 300 that are sequentially deposited on the substrate 101, and a source 310 and a drain 320 that are formed on the polysilicon layer. The source 310 of the thin film transistor 400 is connected to a data line 520, the gate metal layer 120 is connected to a scanning line 510, and the drain 320 is connected to the pixel electrodes 410. The display panel further includes an amorphous silicon layer formed on the gate insulation layer, and a metal seed layer made of a nickel disilicide material and formed on the amorphous silicon layer. The amorphous silicon layer is converted into the polysilicon layer under an induction effect of the metal seed layer and through an annealing treatment.

Specifically, the step of converting the amorphous silicon layer into the polysilicon layer under an induction effect of the metal seed layer and through an annealing treatment includes: converting the amorphous silicon layer into the polysilicon layer through Ni offset metal seed-induced lateral crystallization and the annealing treatment.

The thin film transistor 400 of the display panel 500, which is manufactured by using the foregoing method, reduces the residual metal in the amorphous silicon layer 150 and reduces the leakage current. Moreover, grains grow larger, thereby improving performance of the thin film transistor 400. In addition, in this application, the metal seed layer 200 is deposited after the amorphous silicon layer 150 is formed, that is, after the amorphous silicon thin film layer is patterned through the photomask process, thereby massively reducing an area of the amorphous silicon layer 150 and effectively shortening the crystallization annealing time.

Figure 3:
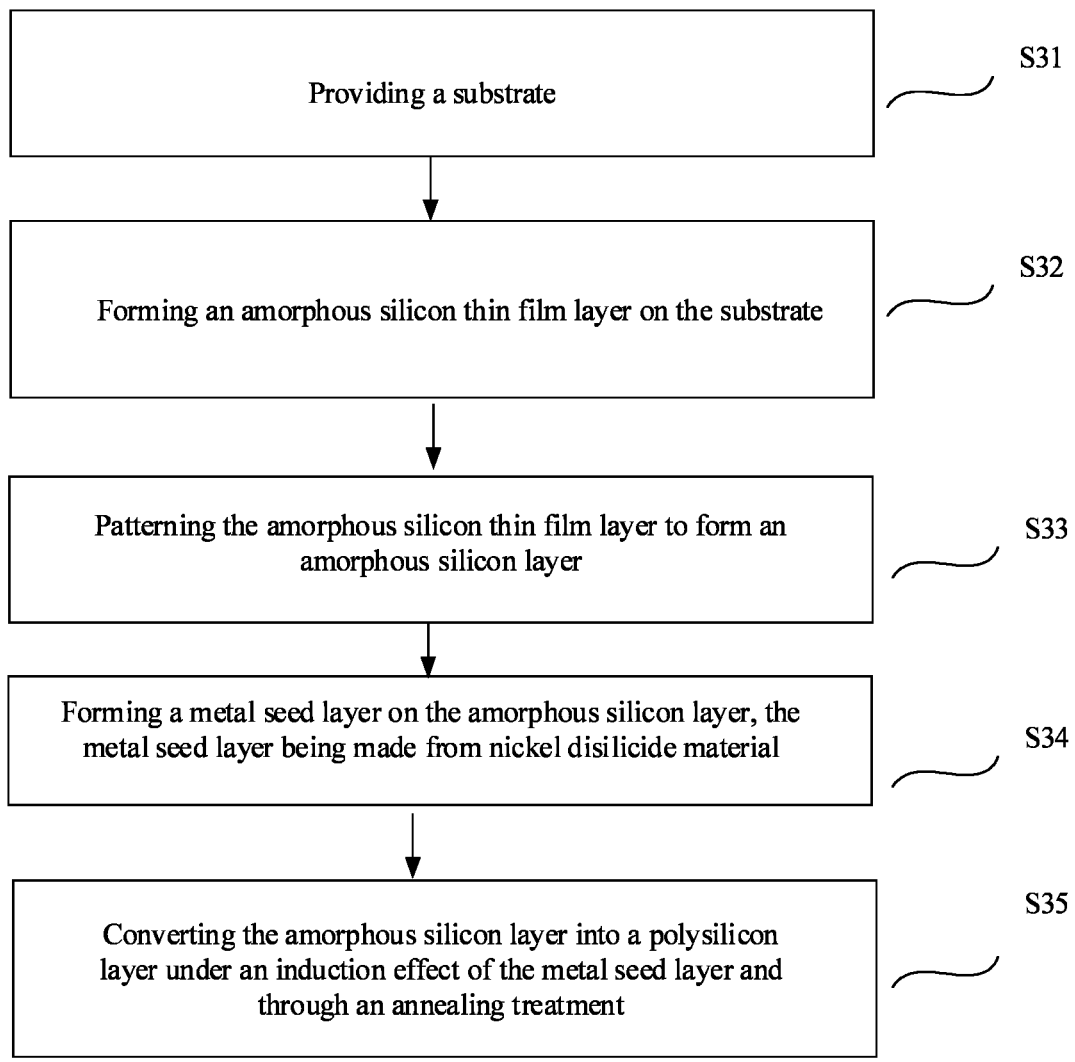
FIG. 3 is a flowchart of a method for manufacturing a thin film transistor according to an embodiment of this application.

As shown in FIG. 3, this application discloses a method for manufacturing a thin film transistor, including:

S31: providing a substrate;

S32: forming an amorphous silicon thin film layer on the substrate;

S33: patterning the amorphous silicon thin film layer to form an amorphous silicon layer;

S34: forming a metal seed layer on the amorphous silicon layer, the metal seed layer being made from nickel disilicide material;

S35: converting the amorphous silicon layer into a polysilicon layer under an induction effect of the metal seed layer and through an annealing treatment.

In the foregoing method of manufacturing a thin film transistor, the metal seed layer is formed on the amorphous silicon layer. During annealing-crystallization, metal ions in the metal seed layer are diffused to the amorphous silicon layer so that the amorphous silicon layer is induced to crystallize to form polysilicon. In a contrast solution, unreacted metal is removed after the annealing-crystallization. A metal layer that remains unreacted before crystallization is not removed. Consequently, more metal atoms are diffused during heating and crystallization, and too many residual metal atoms remain in the thin film transistor, thereby leading to a relatively large leakage current of the thin film transistor.

In this application, the metal seed layer is formed on the amorphous silicon layer, and a metal seed-induced crystallization method is applied. Therefore, only the metal atoms in a seed layer are diffused, thereby effectively reducing the residual metal in the amorphous silicon layer and reducing the leakage current. Moreover, grains grow larger, thereby improving performance of the thin film transistor. In addition, in this application, the metal seed layer is deposited after the amorphous silicon layer is formed, that is, after the amorphous silicon thin film layer is patterned through the photomask process, thereby massively reducing an area of the amorphous silicon layer and effectively shortening the crystallization annealing time. This solution is also applicable to a low-temperature polysilicon (LTPS) technology.

The amorphous silicon layer includes an intrinsic amorphous silicon layer and a doped amorphous silicon layer 156, the doped amorphous silicon layer overlays a surface of the intrinsic amorphous silicon layer, and the metal seed layer is disposed on a surface of the doped amorphous silicon layer. $NiSi_2$ and Si that is located at an interface of the doped amorphous silicon layer (N+a-Si) have higher free energy than Si located at an interface between $NiSi_2$ and c-Si, thereby ensuring $NiSi_2$ to keep moving on from the doped amorphous silicon layer (N+a-Si) interface toward the intrinsic amorphous silicon layer (a-Si). Finally, all the $NiSi_2$ is converted into polysilicon. This method prevents unreacted metal from diffusing throughout the crystallization, and the residual Ni impurity metal is reduced significantly.

The step of forming, on the amorphous silicon layer, a metal seed layer made of a nickel disilicide ($NiSi_2$) material includes:

sputtering the $NiSi_2$ onto a surface of the amorphous silicon layer to form the metal seed layer.

Specifically, magnetron sputtering is applied. A surface of a cathode target material, that is, a $NiSi_2$ material, is bombarded under an effect of a direct-current high-voltage electric field by using a formed ion current, so that kinetic energy and momentum of ions are transferred to atoms on a surface of a solid, and the ions fly off due to breakage of chemical bonds and are deposited on the surface of the amorphous silicon layer. Commonly used bombardment ions are inert gas argon that is ionized under an effect of a high-voltage electric field so as to form an ion current that serves a specific function. Magnetron sputtering makes it easier to quickly deposit ions evenly on a large area of a thin film.

An alternative sputtering method may be radio frequency sputtering, binary sputtering, and reactive sputtering.

The metal seed layer may be formed in a way other than sputtering, for example, may be formed by sol-gel, pulsed laser deposition (PLD), and molecular beam epitaxy.

The step of forming a metal seed layer made of a nickel disilicide ($NiSi_2$) material on the amorphous silicon layer includes:

forming a metallic nickel thin film on the surface of the amorphous silicon layer; and treating the metallic nickel thin film with an acid solvent to form the metal seed layer.

The metallic nickel thin film is deposited on the amorphous silicon layer by sputtering. A method for depositing the metallic nickel thin film may be a magnetron sputtering method, and may be a direct-current sputtering method or a radio frequency sputtering method. Metallic nickel reacts with the amorphous silicon layer first and crystallizes in advance. Subsequently, unreacted metal is removed with an acid solvent to form the metal seed. This solution prolongs crystallization time and generates larger grains, a carrier mobility of the crystallized polysilicon layer is higher, and performance of the manufactured thin film transistor is higher.

More specifically, a thickness range of the metallic nickel thin film is 1~10 nm. The acid solvent includes but is not limited to an acid substance such as sulfuric acid, hydrochloric acid, and nitric acid.

Figure 4:
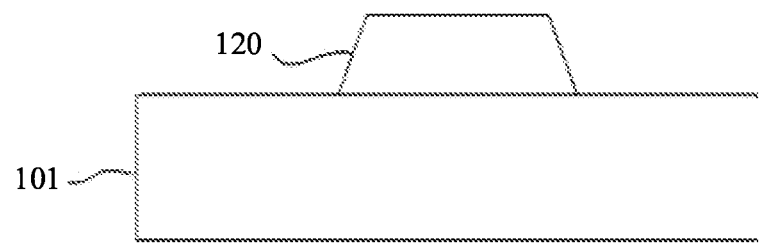
FIG. 4 is a schematic diagram of a method for manufacturing a thin film transistor according to an embodiment of this application.
Figure 5:
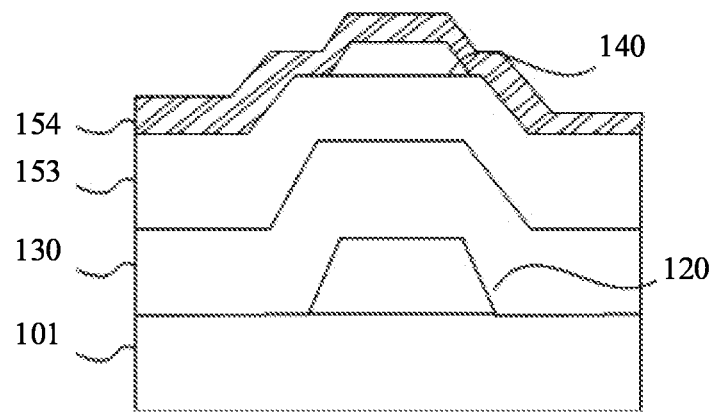
FIG. 5 is a schematic diagram of a method for manufacturing a thin film transistor according to an embodiment of this application.
Figure 6:
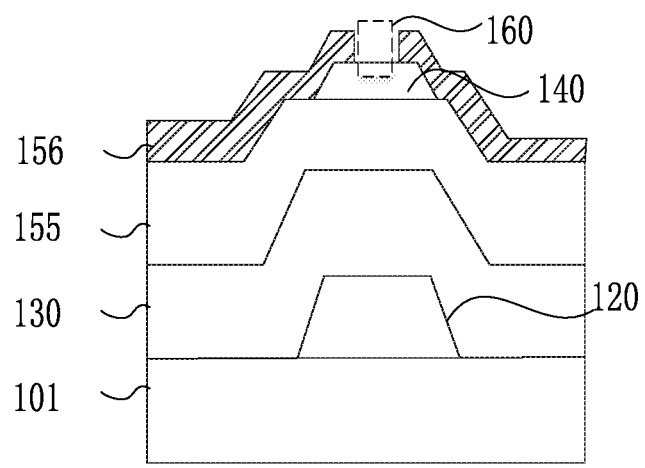
FIG. 6 is a schematic diagram of a method for manufacturing a thin film transistor according to an embodiment of this application.

The amorphous silicon thin film layer includes an intrinsic amorphous silicon thin film layer and a doped amorphous silicon thin film layer. The amorphous silicon layer includes an intrinsic amorphous silicon layer and a doped amorphous silicon layer. The method for forming an amorphous silicon layer on the substrate includes:

forming a gate metal layer on a surface of the substrate by using a first photomask process (see FIG. 4);

sequentially forming a gate insulation layer and an intrinsic amorphous silicon thin film layer on the gate metal layer;

forming an etching barrier layer on the intrinsic amorphous silicon thin film layer by using a second photomask process;

forming a doped amorphous silicon thin film layer on a surface of the etching barrier layer, where the doped amorphous silicon thin film layer overlays the etching barrier layer, and the intrinsic amorphous silicon thin film layer outside a region overlaid by the etching barrier layer (see FIG. 5); and forming an intrinsic amorphous silicon layer and a doped amorphous silicon layer by using a third photomask process (see FIG. 6), where the etching barrier layer is located directly above the gate metal layer, and is smaller than the gate metal layer in width but larger than the doped amorphous silicon layer in thickness; and a channel corresponding to the surface of the etching barrier layer is formed on the doped amorphous silicon layer.

The etching barrier layer 140 ensures that characteristics of the intrinsic amorphous silicon layer 155 are not affected by other processes, and stabilizes characteristics of the thin film transistor 400.

More specifically, the etching barrier layer 140 does not exceed 5 nm, and improves homogeneity of the surface of the thin film transistor 400. The gate metal layer 120 is a stacked combination of one or more of aluminum, molybdenum, titanium, and copper. To increase adhesion of the gate metal layer 120, a buffer layer 110 may be formed on the surface of the substrate 101 first, and then the gate metal layer 120 may be formed on the buffer layer 110. Subsequently, the gate insulation layer 130 may be deposited on the gate metal layer 120 through chemical deposition, specifically, through plasma enhanced chemical vapor deposition (PECVD). The substrate 101 is made of a glass material, or made of transparent rigid plastic. The buffer layer 110, the gate insulation layer 130, and the etching barrier layer 140 are silicon oxide layers, silicon nitride layers, or composite layers of superimposed silicon oxide and silicon nitride.

Figure 7:
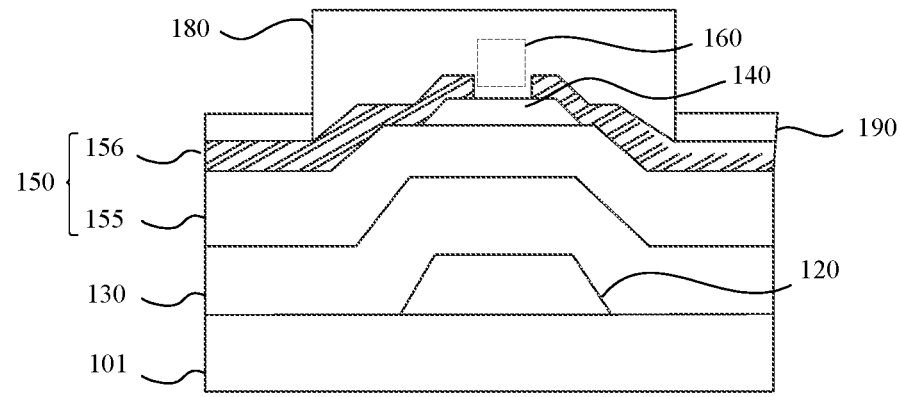
FIG. 7 is a schematic diagram of a method for manufacturing a thin film transistor according to an embodiment of this application.
Figure 8:
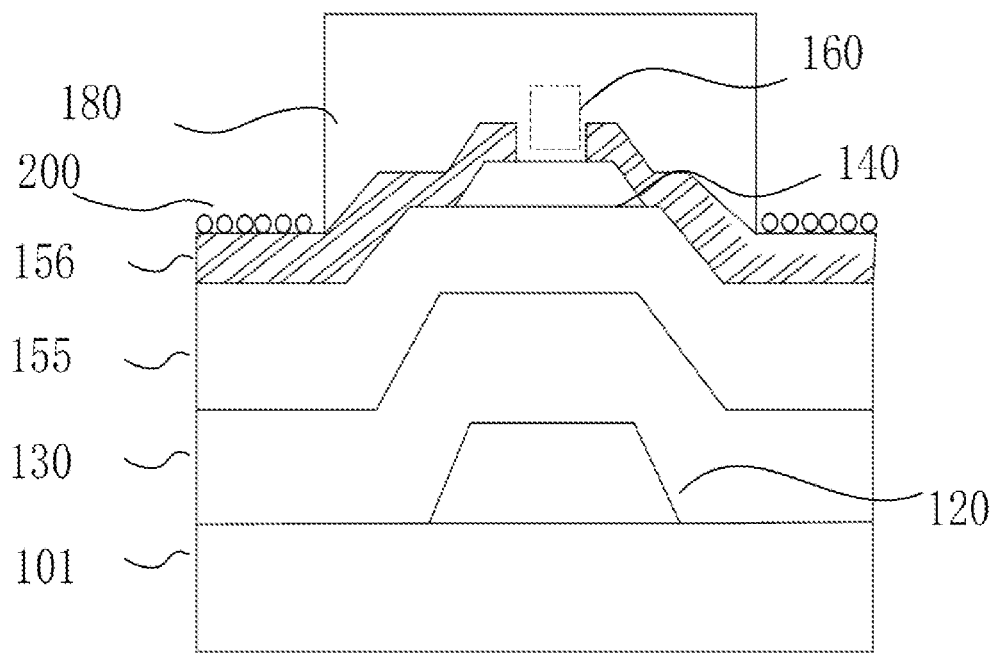
FIG. 8 is a schematic diagram of a method for manufacturing a thin film transistor according to an embodiment of this application.

The step of forming a metal seed layer on the amorphous silicon layer, the metal seed layer being made from nickel disilicide material includes:

forming a protection layer that overlays the channel by using a fourth photomask process;

forming a metallic nickel thin film on the surface of the doped amorphous silicon layer (see FIG. 7); and treating the metallic nickel thin film with an acid solvent to form the metal seed layer (see FIG. 8).

Figure 9:
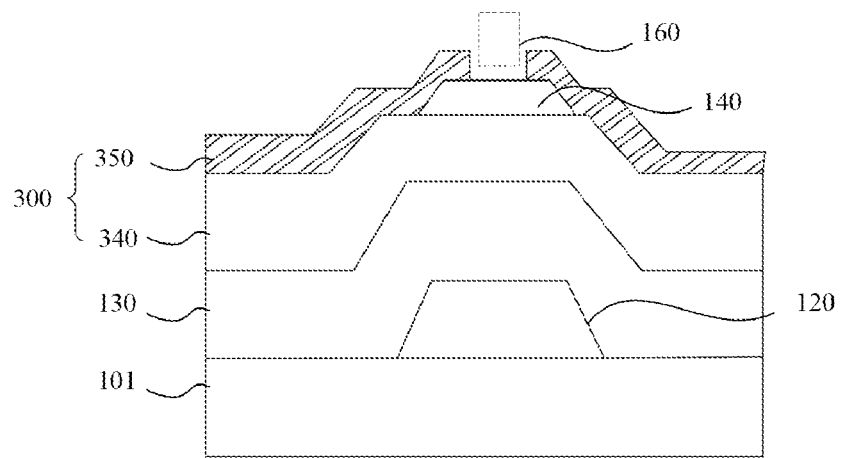
FIG. 9 is a schematic diagram of a method for manufacturing a thin film transistor according to an embodiment of this application.

Through an induction effect of the metal seed layer 200 and an annealing treatment, the intrinsic amorphous silicon layer 155 is converted into an intrinsic polysilicon layer 340, and the doped amorphous silicon layer 156 is converted into a doped polysilicon layer 350 (see FIG. 9). The channel 160 is protected by the protection layer 180 so that the metal seed is not directly deposited on the conductive channel 160. The polysilicon formed by using a lateral diffusion method not only leaves little metal residue, but also leads to a relatively large size of grains. More specifically, the protection layer 180 is made of a photoresist material.

Alternatively, in this embodiment, the nickel disilicide may be directly sputtered on the surface of the doped amorphous silicon layer 156 to form the metal seed layer 200.

In one or more embodiments, a temperature range of the annealing-crystallization is between 400° C. and 600° C., and a time range of the annealing-crystallization is between 0.5 h and 2 h. Under the high-temperature induction, the nickel disilicide layer is disrupted, and Ni atoms keep moving into the doped amorphous silicon layer 156 and the intrinsic amorphous silicon layer 155, and then form nickel disilicide. The following process is repeated until the doped amorphous silicon layer 156 and the intrinsic amorphous silicon layer 155 fully change into a crystalline state. If the induction is performed before the amorphous silicon thin film layer is patterned, the induction consumes more than 20 hours. In this application, the induction is performed after the amorphous silicon thin film layer is patterned through the photomask process, thereby significantly reducing the annealing time to approximately 0.5 h to 2 h.

More specifically, in the metal-induced lateral crystallization (MILC) method, metal does not directly cause silicon crystallization, but a silicide generated by chemical reaction between the metal and silicon causes silicon crystallization. When the crystallization continues, the silicide is diffused along a lateral direction of silicon to cause continuous crystallization of adjacent silicon regions. A metal that causes the MILC is nickel, palladium, or another similar metal. Accordingly, in the MILC method, almost no metal components remain in the silicon layer. Therefore, the crystallized silicon layer does not affect a leakage current or other characteristics of the TFT of the silicon-containing layer. In addition, in the metal-induced lateral crystallization method, the application adopts an asymmetric metal offset method. Compared with a thin film transistor of a symmetric nickel offset structure, the thin film transistor in this application provides desirable electrical characteristics such as a higher field-effect mobility and a smaller leakage current. That is because the electrical characteristics of the channel region 160 of the thin film transistor of a symmetric offset structure are adversely affected by an MILC boundary of remaining nickel silicide.

Figure 10:
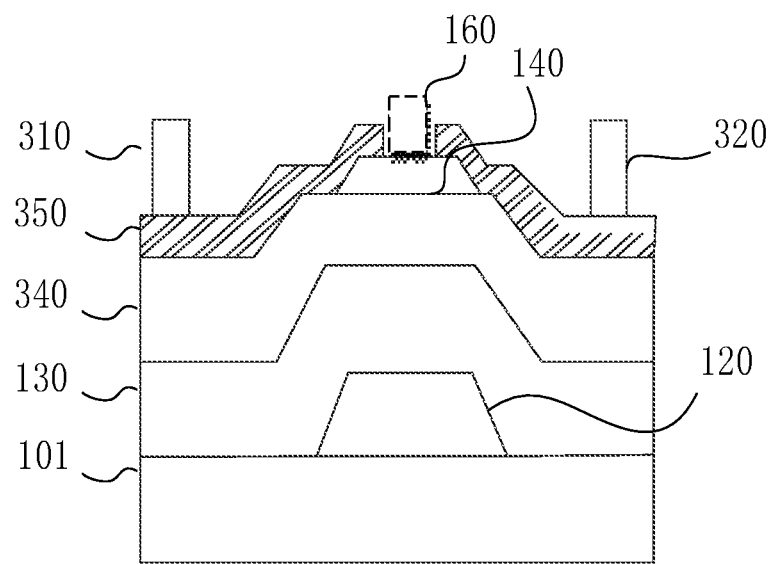
FIG. 10 is a schematic diagram of a method for manufacturing a thin film transistor according to an embodiment of this application.

After the amorphous silicon layer is converted into a polysilicon layer under an induction effect of the metal seed layer and through an annealing treatment, a source and drain forming method is included:

forming a source and a drain on the doped polysilicon layer by using a fifth photomask process; and forming an insulation interlayer on the source and the drain (see FIG. 10).

The source 310 and the drain 320 are arranged on two sides of the channel 160 respectively, and are in contact with the doped polysilicon layer 350. The source 310 and the drain 320 are a stacked combination of one or more of aluminum, molybdenum, titanium, and copper. The insulation interlayer 330 is a silicon oxide layer, a silicon nitride layer, or a composite layer of superimposed silicon oxide and silicon nitride.

Figure 11:
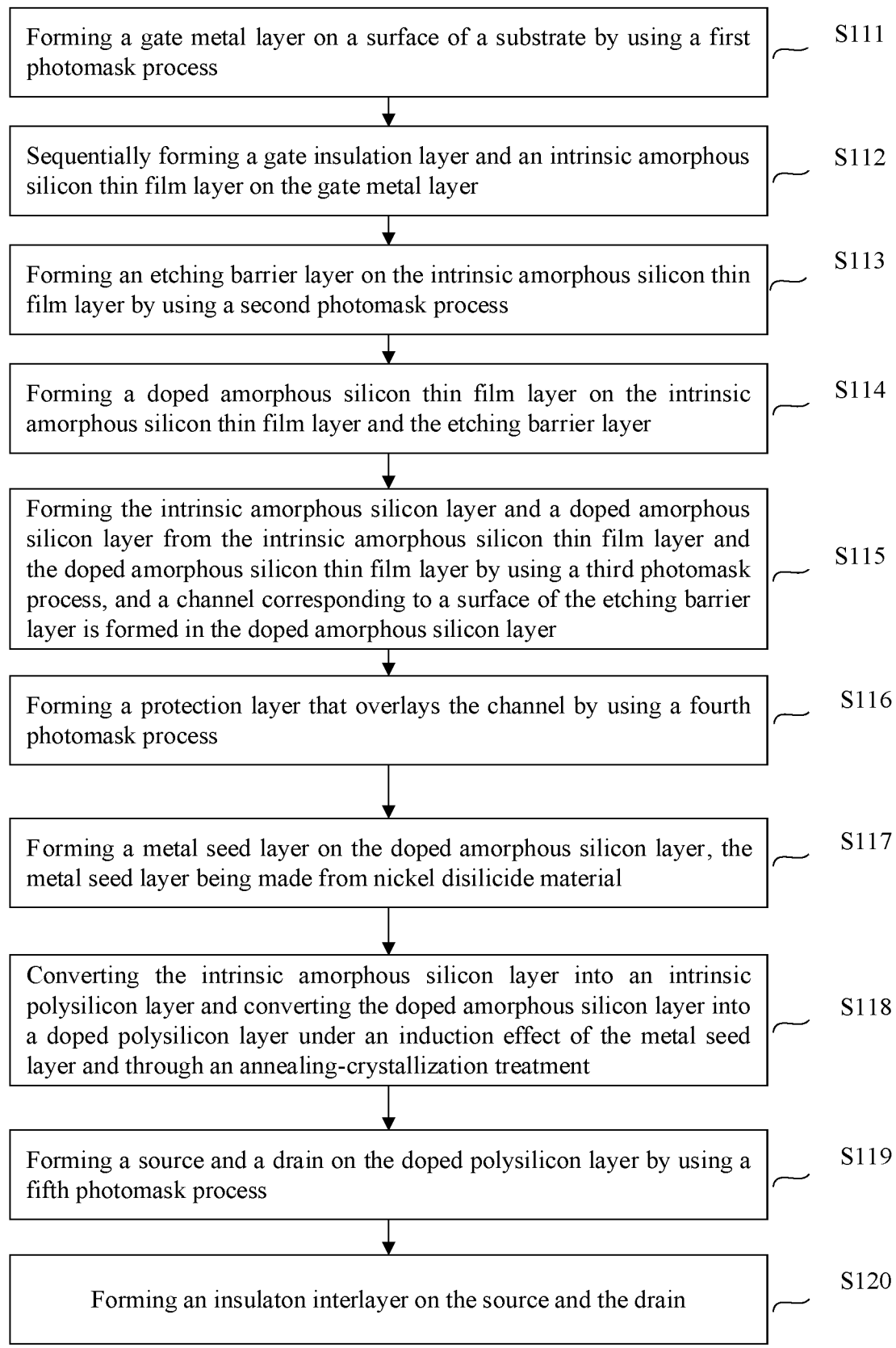
FIG. 11 is a flowchart of a method for manufacturing a thin film transistor according to an embodiment of this application.

In one or more embodiments, referring to FIG. 11, this application further discloses a method for manufacturing a thin film transistor. The steps of the method include:

S111: forming a gate metal layer on a surface of a substrate by using a first photomask process;

S112: sequentially forming a gate insulation layer and an intrinsic amorphous silicon thin film layer on the gate metal layer;

S113: forming an etching barrier layer on an intrinsic amorphous silicon layer by using a second photomask process;

S114: forming a doped amorphous silicon thin film layer on the etching barrier layer, where the doped amorphous silicon thin film layer overlays the etching barrier layer, and the intrinsic amorphous silicon thin film layer outside a region overlaid by the etching barrier layer;

S115: forming the intrinsic amorphous silicon layer and a doped amorphous silicon layer by using a third photomask process, and a channel corresponding to the surface of the etching barrier layer is formed on the doped amorphous silicon layer;

S116: forming a protection layer that overlays the channel by using a fourth photomask process;

S117: forming a metal seed layer on the amorphous silicon layer, the metal seed layer being made from nickel disilicide material;

S118: converting the intrinsic amorphous silicon layer into an intrinsic polysilicon layer under an induction effect of the metal seed layer and through an annealing treatment, converting the doped amorphous silicon layer into a doped polysilicon layer under an induction effect of the metal seed layer and through an annealing treatment;

S119: forming a source and a drain on the doped polysilicon layer by using a fifth photomask process; and S120: forming an insulation interlayer on the source and the drain.

A temperature range of the annealing-crystallization is between 400° C. and 600° C., and a time range of the annealing-crystallization is between 0.5 h and 2 h.

Specifically, the insulation interlayer is a silicon oxide layer, a silicon nitride layer, or a composite layer of superimposed silicon oxide and silicon nitride.

It needs to be noted that, to the extent that the implementation of the specific solution is not affected, no limitation on a step in this solution is considered to be a limitation on the order of steps. A step written before another step may be performed before or after the other step, or even performed simultaneously. All variations capable of implementing this solution fall within the protection scope of this application.

The technical solution of this application is widely applicable to flat-panel displays such as a thin film transistor-liquid crystal display (Thin Film Transistor-Liquid Crystal Display, TFT-LCD) and an organic light emitting diode (Organic Light-Emitting Diode, OLED) display.

The foregoing content is a detailed description of this application made with reference with specific optional embodiments, but the specific implementation of this application is not limited to such description. Simple derivations or replacements may be made by a person of ordinary skill in the art of this application without departing from the conception of this application, and all such derivations and replacements fall within the protection scope of this application.

What is claimed is:

1. A method for manufacturing a thin film transistor, comprising steps of:
    providing a substrate;
    forming an amorphous silicon thin film layer on the substrate;
    patterning the amorphous silicon thin film layer to form an amorphous silicon layer;
    forming a metal seed layer on the amorphous silicon layer, the metal seed layer being made from nickel disilicide material; and
    converting the amorphous silicon layer into a polysilicon layer under an induction effect of the metal seed layer and through an annealing treatment;
    wherein the amorphous silicon layer comprises an intrinsic amorphous silicon layer and a doped amorphous silicon layer, the doped amorphous silicon layer overlays a surface of the intrinsic amorphous silicon layer, and the metal seed layer is disposed on a surface of the doped amorphous silicon layer;
    wherein the amorphous silicon layer is formed on the substrate by the following steps:
    forming a gate metal layer on a surface of the substrate;
    sequentially forming a gate insulation layer and an intrinsic amorphous silicon thin film layer on the gate metal layer;
    forming an etching barrier layer on the intrinsic amorphous silicon thin film layer;
    forming a doped amorphous silicon thin film layer on a surface of the etching barrier layer, wherein the doped amorphous silicon thin film layer overlays the etching barrier layer, and the intrinsic amorphous silicon thin film layer outside a region overlaid by the etching barrier layer; and
    patterning the intrinsic amorphous silicon thin film layer and the doped amorphous silicon thin film layer to form the intrinsic amorphous silicon layer and the doped amorphous silicon layer that form the amorphous silicon layer, wherein the etching barrier layer is located directly above the gate metal layer, and is smaller than the gate metal layer in width, but larger than the doped amorphous silicon layer in thickness; and wherein a channel corresponding to the surface of the etching barrier layer is formed in the doped amorphous silicon layer.

2. The method for manufacturing a thin film transistor according to claim 1, wherein the step of forming a metal seed layer on the amorphous silicon layer, the metal seed layer being made from nickel disilicide material comprises:
    sputtering the nickel disilicide onto a surface of the amorphous silicon layer to form the metal seed layer.

3. The method for manufacturing a thin film transistor according to claim 2, wherein the step of sputtering the nickel disilicide onto a surface of the amorphous silicon layer to form the metal seed layer comprises: magnetron-sputtering the nickel disilicide onto the surface of the amorphous silicon layer.

4. The method for manufacturing a thin film transistor according to claim 1, wherein the step of forming a metal seed layer on the amorphous silicon layer, the metal seed layer being made from nickel disilicide material comprises:
    forming a metallic nickel thin film on the surface of the amorphous silicon layer; and
    treating the metallic nickel thin film with an acid solvent to form the metal seed layer.

5. The method for manufacturing a thin film transistor according to claim 4, wherein the acid solvent comprises sulfuric acid, hydrochloric acid, or nitric acid.

6. The method for manufacturing a thin film transistor according to claim 1, wherein the gate insulation layer and the etching barrier layer each comprise a silicon oxide layer, a silicon nitride layer, or a composite layer of superimposed silicon oxide and silicon nitride.

7. The method for manufacturing a thin film transistor according to claim 1, wherein the thickness of the etching barrier layer is not more than 5 nm.

8. The method for manufacturing a thin film transistor according to claim 1, wherein a buffer layer is arranged between the gate metal layer and the substrate.

9. The method for manufacturing a thin film transistor according to claim 1, wherein the gate insulation layer is deposited on the gate metal layer by means of chemical deposition.

10. The method for manufacturing a thin film transistor according to claim 9, wherein the chemical deposition is plasma enhanced chemical vapor deposition.

11. The method for manufacturing a thin film transistor according to claim 1, wherein the step of forming a metal seed layer on the amorphous silicon layer, the metal seed layer being made from nickel disilicide material comprises:
    forming a protection layer that overlays the channel; and
    forming the metal seed layer on the doped amorphous silicon layer.

12. The method for manufacturing a thin film transistor according to claim 1, wherein the step of converting the amorphous silicon layer into a polysilicon layer under an induction effect of the metal seed layer and through an annealing treatment comprises:
converting the intrinsic amorphous silicon layer into an intrinsic polysilicon layer and converting the doped amorphous silicon layer into a doped polysilicon layer by annealing-crystallization; wherein a temperature range of the annealing-crystallization is between 400° C. and 600° C., and a time range of the annealing-crystallization is between 0.5 h and 2 h.

13. The method for manufacturing a thin film transistor according to claim 1, wherein the method further comprises, after the amorphous silicon layer is converted into the polysilicon layer under the induction effect of the metal seed layer and through the annealing treatment, a source and drain forming step comprising:
forming a source and a drain on the doped polysilicon layer; and
forming an insulation interlayer on the source and the drain.

14. The method for manufacturing a thin film transistor according to claim 13, wherein the insulation interlayer comprises a silicon oxide layer, a silicon nitride layer, or a composite layer of superimposed silicon oxide and silicon nitride.

15. A method for manufacturing a thin film transistor, comprising:
forming a gate metal layer on a surface of a substrate by using a first photomask process;
sequentially forming a gate insulation layer and an intrinsic amorphous silicon thin film layer on the gate metal layer;
forming an etching barrier layer on the intrinsic amorphous silicon thin film layer by using a second photomask process;
forming a doped amorphous silicon thin film layer on the etching barrier layer, wherein the doped amorphous silicon thin film layer overlays the etching barrier layer, and the intrinsic amorphous silicon thin film layer outside a region overlaid by the etching barrier layer;
forming the intrinsic amorphous silicon layer and a doped amorphous silicon layer from the intrinsic amorphous silicon thin film layer and the doped amorphous silicon thin film layer by using a third photomask process, and a channel corresponding to a surface of the etching barrier layer is formed in the doped amorphous silicon layer;
forming a protection layer that overlays the channel by using a fourth photomask process;
forming a metal seed layer made of a nickel disilicide material on the doped amorphous silicon layer;
converting the intrinsic amorphous silicon layer into an intrinsic polysilicon layer and converting the doped amorphous silicon layer into a doped polysilicon layer under an induction effect of the metal seed layer and through an annealing-crystallization treatment;
forming a source and a drain on the doped polysilicon layer by using a fifth photomask process; and
forming an insulation interlayer on the source and the drain, wherein
a temperature range of the annealing-crystallization is between 400° C. and 600° C., and a time range of the annealing-crystallization is between 0.5 h and 2 h.

16. A display panel, comprising a plurality of scanning lines, a plurality of data lines, a plurality of pixel electrodes, and a plurality of active switches, wherein each active switch is a thin film transistor, and the thin film transistors each comprise:
a substrate; and
a gate metal layer, a gate insulation layer, a polysilicon layer, a source and a drain that are sequentially formed on the substrate;
the source of the thin film transistor is connected to a corresponding data line, the gate metal layer is connected to a corresponding scanning line, and the drain is connected to a corresponding pixel electrode; wherein
the polysilicon layer is made by using the following steps:
forming an amorphous silicon layer on the gate insulation layer;
forming a metal seed layer on the amorphous silicon layer, the metal seed layer being made from nickel disilicide material; and
converting the amorphous silicon layer into the polysilicon layer under an induction effect of the metal seed layer and through an annealing treatment;
wherein the amorphous silicon layer comprises an intrinsic amorphous silicon layer and a doped amorphous silicon layer, the doped amorphous silicon layer overlays a surface of the intrinsic amorphous silicon layer, and the metal seed layer is disposed on a surface of the doped amorphous silicon layer;
wherein the amorphous silicon layer is formed on the substrate by the following steps:
forming a gate metal layer on a surface of the substrate;
sequentially forming a gate insulation layer and an intrinsic amorphous silicon thin film layer on the gate metal layer;
forming an etching barrier layer on the intrinsic amorphous silicon thin film layer;
forming a doped amorphous silicon thin film layer on a surface of the etching barrier layer, wherein the doped amorphous silicon thin film layer overlays the etching barrier layer, and the intrinsic amorphous silicon thin film layer outside a region overlaid by the etching barrier layer; and
patterning the intrinsic amorphous silicon thin film layer and the doped amorphous silicon thin film layer to form the intrinsic amorphous silicon layer and the doped amorphous silicon layer that form the amorphous silicon layer, wherein the etching barrier layer is located directly above the gate metal layer, and is smaller than the gate metal layer in width, but larger than the doped amorphous silicon layer in thickness; and wherein a channel corresponding to the surface of the etching barrier layer is formed in the doped amorphous silicon layer.

17. The display panel according to claim 16, wherein the step of converting the amorphous silicon layer into the polysilicon layer under an induction effect of the metal seed layer and through an annealing treatment comprises: converting the amorphous silicon layer into the polysilicon layer through Ni offset metal seed-induced lateral crystallization and the annealing treatment.

* * * * *